(12) United States Patent
Wang

(10) Patent No.: US 9,480,171 B2
(45) Date of Patent: Oct. 25, 2016

(54) PRINTING CIRCUIT BOARD WITH TRACES IN AN INSULATOR

(71) Applicant: Chung-Pao Wang, Taichung (TW)

(72) Inventor: Chung-Pao Wang, Taichung (TW)

( * ) Notice: Subject to any disclaimer, the term of this patent is extended or adjusted under 35 U.S.C. 154(b) by 99 days.

(21) Appl. No.: 14/274,776

(22) Filed: May 12, 2014

(65) Prior Publication Data

US 2014/0338957 A1    Nov. 20, 2014

(30) Foreign Application Priority Data

May 20, 2013   (TW) .............................. 102117696 A
Apr. 23, 2014  (TW) .............................. 103114633 A

(51) Int. Cl.
| | | |
|---|---|---|
| H05K 1/02 | (2006.01) | |
| H05K 3/40 | (2006.01) | |
| H05K 1/11 | (2006.01) | |
| H01L 23/498 | (2006.01) | |
| H05K 3/34 | (2006.01) | |
| H01L 23/00 | (2006.01) | |

(52) U.S. Cl.
CPC ....... *H05K 3/4038* (2013.01); *H01L 23/49827* (2013.01); *H05K 1/115* (2013.01); *H01L 24/13* (2013.01); *H01L 24/48* (2013.01); *H01L 2224/13101* (2013.01); *H01L 2224/48091* (2013.01); *H01L 2224/48227* (2013.01); *H01L 2224/48228* (2013.01); *H01L 2224/81439* (2013.01); *H01L 2224/81444* (2013.01); *H01L 2224/85439* (2013.01); *H01L 2224/85444* (2013.01); *H01L 2924/00014* (2013.01); *H01L 2924/15311* (2013.01); *H05K 3/3478* (2013.01); *H05K 2203/041* (2013.01)

(58) Field of Classification Search
CPC ................. H05K 1/0296; H05K 2201/09218; H05K 2201/10287; H05K 7/06; H05K 3/4038; H05K 1/115; H05K 3/3478; H05K 2203/041; H01L 2924/00; H01L 2924/00014; H01L 2224/041; H01L 2224/48227; H01L 2224/48228; H01L 2924/15311; H01L 24/13; H01L 24/48; H01L 2224/13101; H01L 2224/81444; H01L 2224/85439; H01L 2224/85444; H01L 2924/0014; H01L 23/49827
See application file for complete search history.

(56) References Cited

U.S. PATENT DOCUMENTS

| | | | | |
|---|---|---|---|---|
| 6,674,159 B1 * | 1/2004 | Peterson | ............... | B81B 7/0067 257/431 |
| 7,094,676 B1 * | 8/2006 | Leu | ..................... | H01L 23/3128 257/E23.178 |
| 7,129,572 B2 * | 10/2006 | Wang | ..................... | H01L 23/13 257/686 |
| 7,394,425 B2 * | 7/2008 | Luch | ........................ | H01Q 9/27 343/700 MS |
| 7,786,567 B2 * | 8/2010 | Wang | .................. | H01L 23/3121 257/693 |
| 7,868,431 B2 * | 1/2011 | Feng | .................... | H01F 17/0033 257/673 |
| 2011/0242782 A1 * | 10/2011 | Wang | ..................... | H05K 1/115 361/783 |
| 2014/0264792 A1 * | 9/2014 | Yang | .................. | H01L 23/5385 257/666 |

* cited by examiner

*Primary Examiner* — Michael Zarroli

(57) ABSTRACT

A printing circuit board includes: an insulator having an upper surface, a lower surface and an opening formed in the lower surface, and a trace having an upper surface, a lower surface and a side edge and received in said insulator. The upper surface of said trace is exposed out of the insulator and a portion of the lower surface of said trace is exposed by said opening for external connection.

17 Claims, 3 Drawing Sheets

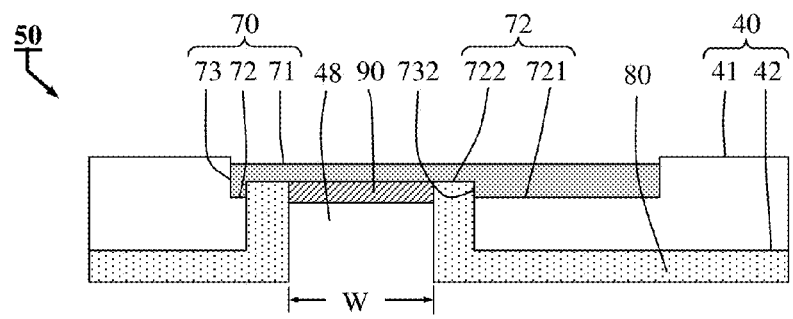
Fig. 4
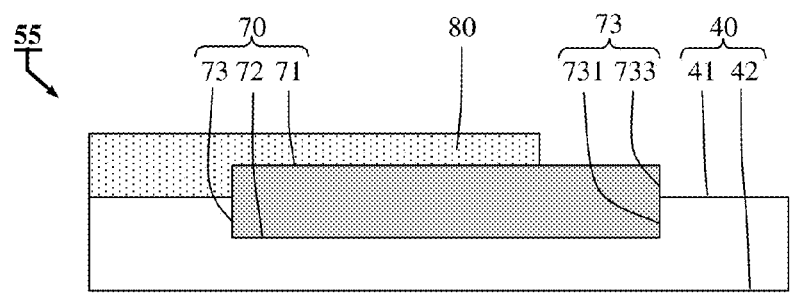
Fig. 5
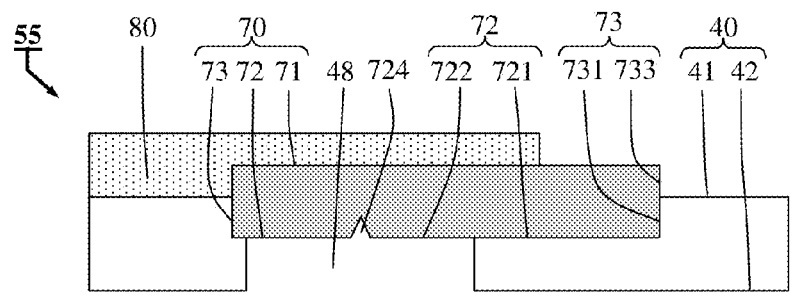
Fug. 6

PRINTING CIRCUIT BOARD WITH TRACES IN AN INSULATOR

BACKGROUND OF THE INVENTION

1. Field of the Invention

The present invention generally relates to a Printing Circuit Board, and more particularly related to a PCB which is comprised of an insulator and a trace embedded therein, wherein both the upper surface of trace and a portion of the lower surface of trace exposed to the atmosphere for connecting external substance.

2. Description of the Related Art

Nowadays, both science and technology are developing rapidly, meanwhile, electrical devices are designed for thinner, wider application, lower cost, and better reliability, wherein in order to achieve above objects, the manufacturers keep on developing it.

FIG. 9 shows a conventional PCB 52 comprised of: an insulator 40 which is made of FR-4 or BT (Bismaleimide Triazine) or epoxy etc. having a blind via 44, an upper surface 41 and a lower surface 42; said blind via 44 is for accommodating a portion of trace 7A; a ball pad 7B which is made of metal such as copper for external connection (e.g. solder ball), said ball pad 7B having a side edge 7B3, an upper surface 7B1, and a lower surface 7B2, wherein both said side edge 7B3 and a portion of lower surface 7B2 of trace 7A encapsulated by said insulator 40, wherein another portion of lower surface 7B2 exposed to blind via 44 for being coupled with said trace 7A, said upper surface 7B1 of ball pad 7B exposed out of the lower surface 42 of insulator 40 for external connection (i.e. said upper surface 7B1 of ball pad 7B exposed to atmosphere for external connection); a trace 7A which is made of metal such as copper for being employed as a path of transmitting electrical current, said trace 7A having a side edge 7A3, an upper surface 7A1 and a lower surface 7A2, wherein said lower surface 7A2 coupled with said upper surface 41 of insulator 40, a portion of trace 7A accommodated in said blind via 44, in this manner, said trace 7A electrically connected to said ball pad 7B through said blind via 44; a solder mask 80 covering both said upper surface 41 of insulator 40 and a portion of said trace 7A, wherein another portion of said trace 7A being exposed to the atmosphere for external connection; and a plurality of conductive layers 90 which are made of nickel, gold, silver or the like are valuable and expensive, said conductive layers 90 coupled with said upper surface 7B1 of ball pad 7B and the portion of trace 7A exposed to atmosphere (i.e. both said another portion of upper surface 7A1 and said side edge 7A3) respectively; accordingly, (1). The path of transmitting electrical current from the upper surface 41 of insulator 40 to the lower surface 42 of insulator 40 of said conventional PCB 52 is from the upper surface 7A1 of trace 7A through said blind via 44 of insulator 40 to said upper surface 7B1 of ball pad 7B; (2). said solder mask 80 having a thickness Ta which is comprised of a thickness T81 and a thickness T82, wherein said thickness T81 is the distance between the upper surface 7A1 of trace 7A and the upper surface 41 of insulator 40, said thickness T82 is the distance between the upper surface of said solder mask 80 and the upper surface 7A1 of trace 7A, consequently, according to the features of conventional PCB 52 mentioned above, the thickness T52 which is included the thickness T4 of insulator 40 and thickness Ta becomes thicker, in this manner, it is not convenient for said conventional PCB 52 to be used in the electronic industries; (3). said side edge 7A3 of trace 7A also needs to be covered with said conductive layer 90, in this manner, more material needs to be used, then the cost for manufacturing said conventional PCB 52 becomes higher; and (4). Due to there is not any solder mask coupled with the lower surface 42 of insulator 40, then said ball pad 7B can't be employed as a path of transmitting electrical current but be employed as a terminal for external connection (e.g. solder ball) exclusively, in this manner, said ball pad 7B enables not to be layout on said lower surface 42 of insulator 40 freely, moreover, said ball pad 7B is oxidized and damaged easily without solder mask protecting; meanwhile, due to it is difficult for the width "W" of ball pad 7B to be changed, when said ball pad 7B coupled with said lower surface 42 of insulator 40, then it is restricted for said conventional PCB 52 to be used in electronic industry; For example: in case that the volume of solder ball (not shown) is unchanged, and the height of solder ball is needed to be decreased (i.e. said width "W" of ball pad 7B is needed to become wider for reaching the demand mentioned above), nevertheless, due to said width "W" of ball pad 7B can't be changed to become wider for reaching said demand when said ball pad 7B coupled with said lower surface 42 of insulator 40, then the height of solder ball 7B can't be reached to the qualification of electrical device(s) such as PBGA or CSP, in this manner, said conventional PCB 52 enables not to be invited to said electrical devices, as this result, the application of said conventional PCB 52 is restricted.

SUMMARY OF THE INVENTION

It is therefore an object of the invention to solve the mentioned-above problems, in accordance with the invention, the PCB includes an insulator and a plurality of traces, wherein said traces are embedded in the insulator, and wherein both the upper surface and a portion of the lower surface of said trace exposed out of said insulator, in this manner, both said upper surface and said portion of the lower surface of said trace exposed to atmosphere for connecting external substance, nevertheless, another portion of the lower surface of trace encapsulated by said insulator, in this manner, it is not necessary for said lower surface of trace to be coupled with a solder mask which is for protecting said lower surface of trace, as this result, the advantages of said PCB includes: (1). the cost is saved; (2). the thickness is thinner; (3). the reliability of said PCB is enhanced; (4). the blind via can be omitted; and (5). it is more convenient for the PCB to be used in electronic industries in accordance with the present invention, moreover, the trace of PCB can further include an extending portion.

The aforementioned and further objects of the present invention will more adequately appeared from the detailed description, accompanying drawings and appended claims as follow.

BRIEF DESCRIPTION OF THE DRAWINGS

FIG. 4 shows a cross-sectional view of PCB in accordance with the present invention, wherein a solder mask coupled with the lower surface of insulator.

FIG. 5-6 show cross-sectional views of PCB in accordance with the present invention, wherein the upper surface protruded the upper surface of insulator and exposed to the atmosphere.

DETAILED DESCRIPTION OF PREFERRED EMBODIMENTS

Embodiments of the present invention will be explained with reference to the drawings as follow.

Figure 1:
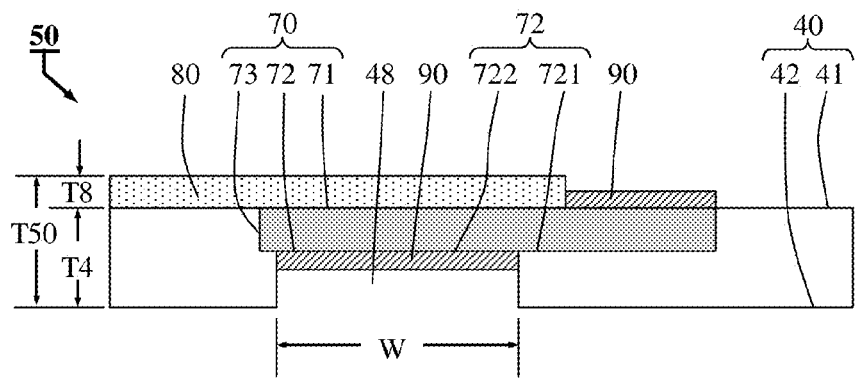
FIG. 1 shows a cross-sectional view of PCB in accordance with the present invention, wherein a trace embedded in the insulator.

FIG. 1 shows a PCB 50 comprising: an insulator 40 is made of FR-4, BT, epoxy or the like, said insulator 40 having an upper surface 41, a lower surface 42 and a recess 48; a trace 70 is made of copper, copper alloy, nickel, aluminum or the like, said trace 70 having an upper surface 71, a lower surface 72 and a side edge 73, wherein said lower surface 72 of trace 70 consists of a first lower surface 721 and a second lower surface 722, both said first lower surface 721 and said second lower surface 722 are co-planar, said trace 70 embedded in said insulator 40, in this manner, said trace 70 is encapsulated by said insulator 40, wherein both said side edge 73 and said first lower surface 721 of trace 70 are encapsulated by said insulator 40, wherein said upper surface 71 of trace 70 exposed to atmosphere (i.e. said upper surface 71 of trace 70 exposed out of said upper surface 41 of insulator 40) for connecting external substance(s), and wherein said second lower surface 722 of trace 70 placed within said recess 48 of insulator 40, and wherein said second lower surface 722 is the bottom of said recess 48 of insulator 40, said second lower surface 722 of trace 70 exposed to atmosphere (i.e. said second lower surface 722 of trace 70 exposed out of said lower surface 42 of insulator 40) for connecting external substance(s), meanwhile, said first lower surface 721 corresponding to the portion of said upper surface 71 of trace 70 enables to be employed as a path for transmitting electrical current, and furthermore, said second lower surface 722 of trace 70 is employed as a ball pad too (refer to the detailed descriptions of FIG. 8), accordingly, Not only said trace 70 enables to be employed as a path for transmitting electrical current, but said second lower surface 722 of trace 70 enables to be employed as a ball pad; a solder mask 80 covering said upper surface 41 of insulator 40 and a portion of said upper surface 71 of trace 70 for protection, wherein another portion of said upper surface 71 of trace 70 exposed to atmosphere for connecting external substance, wherein said solder mask 80 is optional, and wherein external substance(s) employed as: solder ball, conductive wire, conductive layer, resistor, capacitor, another trace (refer to the detailed descriptions of FIG. 3) and/or a slot of electrical device (e.g. camera, cell phone); and a plurality of conductive layers 90, said conductive layers 90 coupled with said upper surface 71 and said second lower surface 722 of trace 70 respectively, wherein the conductive layer 90 coupled with said second lower surface 722 of trace 70 is placed within said recess 48 of insulator 40, and wherein each upper surface of conductive layer 90 exposed to the atmosphere for connecting to conductive wire, conductive bump, solder ball, resistor and/or capacitor, said conductive layer 90 can be made of either a multi-layered metal or a single metal layer. For example: please, refer to the conductive layer 90 coupled with said second lower surface 722 of trace 70, In case that (1). said conductive layer 90 is made of a multi-layered metal such as two-layered metal which is comprised of a layer of nickel and a layer of gold (or silver), both said layer of nickel and said layer of gold are stack, wherein the lower surface (not shown) of said layer of nickel is employed as said lower surface of conductive layer 90, the upper surface (not shown) of said layer of gold is employed as said upper surface of conductive layer 90, the lower surface of said conductive layer 90 coupled with said second lower surface 722, in this manner, the upper surface of conductive layer 90 is exposed to atmosphere; and moreover. In case that said conductive layer 90 is made of a three-layered metal which is comprised of a layer of nickel, a layer of palladium and a layer of gold, wherein said layer of nickel, said layer of palladium and said layer of gold are stack, and wherein said layer of palladium is between said layer of nickel and said layer of gold, in this manner, the lower surface (not shown) of said layer of nickel is employed as said lower surface of conductive layer 90, the upper surface (not shown) of said layer of gold is employed as said upper surface of conductive layer 90, the lower surface of said conductive layer 90 coupled with said second lower surface 722, in this manner, the upper surface of conductive layer 90 is exposed to the atmosphere. In addition, due to gold, palladium, and silver are valuable (expensive), as this reason, the smaller area of conductive layer 90 is, the saved the cost is; and (2). In case that said conductive layer 90 is made of a single metal such as a tin (solder), wherein the lower surface (not shown) of said layer of tin is employed as said lower surface of conductive layer 90, the upper surface (not shown) of said layer of tin is employed as said upper surface of conductive layer 90, the lower surface of conductive layer 90 coupled with said second lower surface 722, in this manner, the upper surface of conductive layer 90 is exposed to the atmosphere; Consequently, the advantages of said PCB 50 in accordance with the present invention are: (a). the path of transmitting electrical current of said PCB 50 from the upper surface 41 of insulator 40 to the lower surface 42 of insulator 40 of said PCB 50 is from the upper surface 71 of trace 70 to said second lower surface 722 of trace 70 exclusively, in this manner, the blind via (shown in FIG. 9, numeral of "44") is omitted; meanwhile, said path of transmitting electrical current of said PCB 50 enables to become shorter, furthermore, the ball pad 7B (shown in FIG. 9) is substituted by the second lower surface 722 of trace 70, wherein due to the blind via (44) is omitted, in this manner, the thickness T50 of PCB 50 enables to be thinner than the thickness T52 of conventional PCB 52 (shown in FIG. 9); moreover, due to the trace 70 embedded in the insulator 40, then it is not necessary for said side edge 73 of trace 70 to be covered with either solder mask 80 or conductive layer 90, in this manner, Not only the thickness T8 of solder mask 80 enables to become thinner than the thickness Ta of solder mask 80 of conventional PCB 52 but the cost of said PCB 50 enables to be saved; and (b). it is easy to respond the demand of height of solder ball, due to the width "W" of second lower surface 722 of trace 70 enables to be changed easily, then it is easy for said PCB 50 to reach the height qualification of electrical device, and then it is convenient for said PCB 50 to be used in electronic industry; For example: in case that the volume of solder ball is unchanged, and the height of solder ball is needed to be decreased (i.e. it is necessary for the width of second lower surface 722 of trace 70 to be getting wider than the width "W" (shown in FIG. 1) for reaching the demand mentioned above), wherein due to said "W" of second lower surface 722 can be changed to become wider, then the height of solder ball can be reached to the qualification of electrical device (i.e. when said trace 70 embedded in said insulator 40, wherein while a wider recess of insulator 40 is formed, and then a wider width of second lower surface 722 is formed too, as this result, said PCB 50 enables to have a wider width of second lower surface 722 of trace 70 to respond the demand mentioned above), in this manner, said PCB 50 enables to be invited to said electrical devices, as this result, the application of said PCB 50 is convenient; In addition, the advantages of said first lower surface 721 of trace 70 is described in FIG. 8 later.

Figure 2:
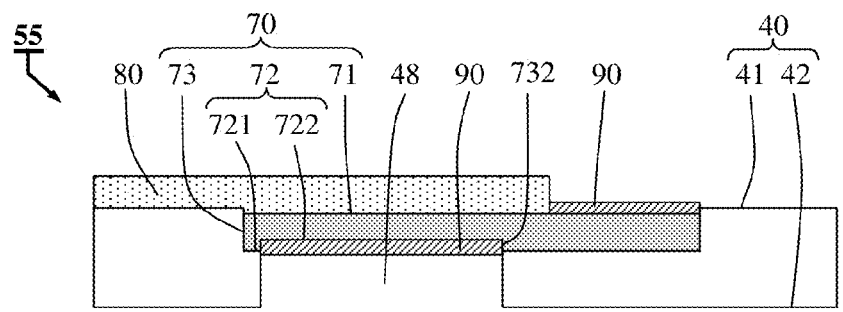
FIG. 2 shows a cross-sectional view of PCB in accordance with the present invention, wherein the trace having a second side edge.

FIG. 2 shows a PCB 55 in accordance with the present invention, said structure of PCB 55 is similar to the structure of PCB 50 shown in FIG. 1, the differences between said PCB 55 and said PCB 50 are: (1). the upper surface 71 of trace 70 of PCB 55 is below the upper surface 41 of insulator 40, in this manner, said upper surface 71 of trace 70 is not co-planar to said upper surface 41 of insulator 40; wherein the upper surface 71 of trace 70 enables to be protruding the upper surface 41 of insulator 40 (refer to FIG. 5 or FIG. 6), said upper surface 71 of trace 70 is not co-planar to said upper surface 41 of insulator 40 either while the upper surface 71 of trace 70 protruding the upper surface 41 of insulator 40, accordingly, it is optional that the upper surface 71 of trace 70 is below the upper surface 41 of insulator 40; and (2). the second lower surface 722 of trace 70 is below the first lower surface 721 of trace 70, in this manner, said second lower surface 722 of trace 70 is not co-planar to said first lower surface 721 of trace 50, in this manner, said trace 70 further having a second side edge 732 which is between said first lower surface 721 and said second lower surface 722 of trace 70, said second side edge 732 of trace 70 placed in said recess 48 of insulator 40 too, Consequently, due to said second side edge 732 of trace 70, the area that said trace 70 contacted to the conductive layer 90 which is coupled with the second lower surface 722 of trace 70 enables to be increased, then it allows said conductive layer 90 to be not only coupled with the second lower surface 722 but also coupled with said second side edge 732 of trace 70, in this manner, said conductive layer 90 enables to be coupled with said trace 70 more securely, then it can prevent said conductive layer 90 from peeling off said trace 70, and then the reliability of said PCB 50 can be enhanced, accordingly, due to said second side edge 732 of trace 70, in case that either a conductive material such as an another trace (refer to FIG. 3) or an isolative material such as a solder mask (refer to FIG. 4) coupled with said second side edge 732, the reliability of said PCB 50 can be enhanced; wherein the second lower surface 722 of trace 70 enables to be protruding the first lower surface 721 of trace 70 (not shown), as this result, said second lower surface 722 of trace 70 is not co-planar to said first lower surface 721 of trace 70 either, accordingly, it is optional that the second lower surface 722 of trace 70 is below the first lower surface 721 of trace 70; furthermore, either the conductive layer 90 coupled with the upper surface 71 of trace 70 or the conductive layer 90 coupled with the second lower surface 722 (associated with the second side edge 732) of trace 70 can be protruding (or below) the upper surface 41 or the lower surface 42 of insulator 40 as required.

Figure 3:
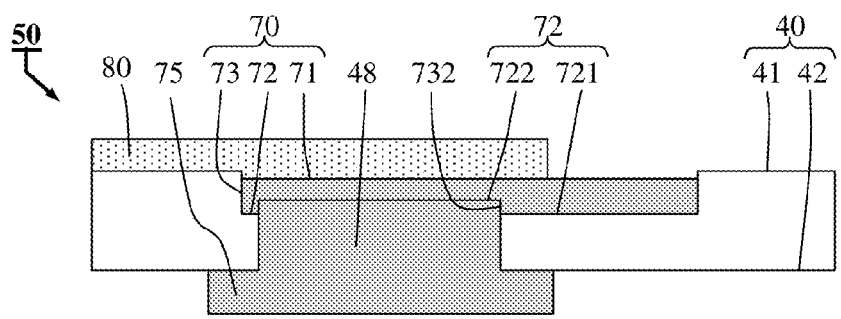
FIG. 3 shows a cross-sectional view of PCB in accordance with the present invention, wherein an another trace coupled with the lower surface of insulator.

FIG. 3 shows a PCB 50 in accordance with the present invention, said structure of PCB 50 is similar to the structure of PCB 55 shown in FIG. 2, the difference between said PCB 50 and said PCB 55 is: said PCB 50 further comprising an another trace 75 which is coupled with the lower surface 42 of insulator 40, in this manner, said another trace 75 enables to be lay out on said lower surface 42 of insulator 40 freely, and wherein a portion of said another trace 75 is placed within said recess 48 of insulator 40 and is coupled with both the second lower surface 722 and the second side edge 732 of trace 70, By means of said second side edge 732 of trace 70, the area that said another trace 75 contacted to the trace 70 enables to be increased, (i.e. it allows said another trace 75 to be not only coupled with the second lower surface 722 but also coupled with said second side edge 732 of trace 70), in this manner, said another trace 75 enables to be coupled with said trace 70 more securely, then it can prevent said another trace 75 from peeling off said trace 70, and then the reliability of said PCB 50 can be enhanced; In additional, a further another trace(s) (not shown) or an another insulator (s) (not shown) can be coupled with the lower surface 42 of insulator 40, in this manner, said PCB 55 is employed as a multi-layer PCB.

FIG. 4 shows a PCB 50 in accordance with the present invention, said structure of PCB 50 is similar to the structure of PCB 55 (shown in FIG. 2), the differences between said PCB 50 and said PCB 55 are: (1). said PCB 50 further comprising a solder mask 80 which is coupled with the lower surface 42 of insulator 40, wherein a portion of said solder mask 80 is placed in said recess 48 of insulator 40 and is coupled with both the second lower surface 722 and the second side edge 732 of trace 70, By means of said second side edge 732 of trace 70, the area that said solder mask 80 contacted to the trace 70 enables to be increased, (i.e. it allows said solder mask 80 to be not only coupled with a portion of the second lower surface 722 but also coupled with said second side edge 732 of trace 70), in this manner, said solder mask 80 enables to be coupled with said trace 70 more securely, then it can prevent said solder mask 80 from peeling off said trace 70, and then the reliability of said PCB 50 can be enhanced; and (2). Due to a portion of said solder mask 80 is placed within said recess 48 of insulator 40 and is coupled with said second lower surface 722 of trace 70, then the width "W" of second lower surface 722 enables to become shorter, and then the materials of said conductive layer 90 coupled with the second lower surface 722 can be saved, in this manner, the cost for manufacturing said PCB 50 can be saved, and it is good to electronic industry.

FIG. 5 shows a PCB 55 comprising: an insulator 40 having an upper surface 41 and a lower surface 42; a trace 70 having an upper surface 71, a lower surface 72 and a side edge 73, wherein said side edge 73 consists of a first side edge 731 and a third side edge 733, said first side edge 731 and said third side edge 733 are co-planar, said trace 70 embedded in said insulator 40, in this manner, said trace 70 is encapsulated by said insulator 40, wherein said first side edge 731 of side edge 73 and said lower surface 72 of trace 70 are encapsulated by said insulator 40, and wherein said upper surface 71 of trace 70 is protruding said upper surface 41 of insulator 40 and said third side edge 733 of side edge 73 is protruding said upper surface 41 of insulator 40 too, in this manner, both said upper surface 71 of trace 70 and said third side edge 733 of side edge 73 exposed to atmosphere (i.e. both said upper surface 71 of trace 70 and said third side edge 733 of side edge 73 exposed out of said upper surface 41 of insulator 40) for connecting external substance(s), moreover, said trace 70 can be employed as either a ball pad or a path of transmitting electrical current; a solder mask 80 covering said upper surface 41 of insulator 40 and a portion of said upper surface 71 of trace 70 for protection, wherein another portion of said upper surface 71 of trace 70 exposed to the atmosphere for connecting external substance, wherein said solder mask 80 is optional; accordingly, By means of said upper surface 71 of trace 70 which is protruding the upper surface 41 of insulator 40, it allows the thickness of said trace 70 to become thicker, in this manner, said PCB 55 enables to respond the demand of high current and high speed transmission, then it is more convenient for said PCB 55 to be used in electronic industries; In addition, said insulator 40 can further have a recess (refer to FIG. 6; numeral "48") on the lower surface 42 of insulator 40 as required, in case that said insulator 40 further having a recess (48), then a portion of said lower surface 72 of trace 70 can be placed therein and exposed to atmosphere (i.e. said a portion of lower surface 72 of trace 70 exposed out of said lower surface 42 of insulator 40) for connecting external substance(s); Moreover, said first side edge 731 and said third side edge 733 enable to be not co-planar (refer to FIG. 7; numerals "731" and "733") as required.

FIG. 6 shows a PCB 55 in accordance with the present invention, said structure of PCB 55 is similar to the structure of PCB 50 (shown in FIG. 1), the differences between said PCB 55 and said PCB 50 are (1). said side edge 73 consists of a first side edge 731 and a third side edge 733, said first side edge 731 and said third side edge 733 are co-planar, wherein said first side edge 731 of side edge 73 and said first lower surface 721 of trace 70 are encapsulated by said insulator 40, wherein said upper surface 71 of trace 70 is protruding said upper surface 41 of insulator 40 and said third side edge 733 of side edge 73 is protruding said upper surface 41 of insulator 40 too, in this manner, both said upper surface 71 of trace 70 and said third side edge 733 of side edge 73 exposed to atmosphere, in this manner, it allows that said trace 70 further having an extending portion (refer to the detailed descriptions of FIG. 7) which is extending on the upper surface 41 of insulator 40 and the thickness of said trace 70 enables to become thicker; and (2). Said trace 70 further having a dimple 724 which is on the second lower surface 722 and is exposed to the atmosphere, in this manner, the second lower surface 722 is uneven (i.e. not flat), meanwhile, By means of said dimple 724 of trace 70, the area that said second lower surface 722 of trace 70 contacted to external substance(s) (such as solder ball, conductive wire, conductive layer, resistor, capacitor, and/or another trace) enables to be increased, in this manner, said trace 70 enables to be coupled with said external substance more securely, then it can prevent said external substance from peeling off said trace 70, and then the reliability of said PCB 55 can be enhanced, wherein the depth (not shown) of said dimple 724 can be 1 μm, 2 μm or more than 2 μm. In additional, said trace 70 also can further have a second side edge (refer to FIG. 2; numeral"732")

Figure 7:
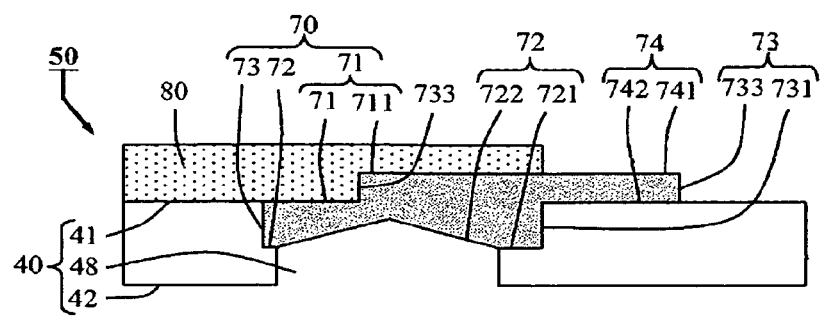
FIG. 7 shows a cross-sectional view of PCB in accordance with the present invention, wherein the trace having an extending portion.

FIG. 7 shows a PCB 50 in accordance with the present invention, said structure of PCB 50 is similar to the structure of PCB 55 (shown in FIG. 6), the differences between said PCB 50 and said PCB 55 are (1). said trace 70 of PCB 50 further having an extending portion 74 which is a portion of said trace 70, said extending portion 74 having an upper surface 741 and a lower surface 742, said lower surface 742 of extending portion 74 coupled with said upper surface 41 of insulator 40, in this manner, said extending portion 74 enables to be extended on said upper surface 41 of insulator 40 freely, as this result, it is more convenient for said PCB 50 to be used in the electronic industry; and wherein said side edge 73 consists of a first side edge 731 and a third side edge 733, said first side edge 731 and said third side edge 733 are not co-planar, wherein said first side edge 731 of side edge 73 and said first lower surface 721 of trace 70 are encapsulated by said insulator 40, and wherein said upper surface 71 of trace 70 is protruding said upper surface 41 of insulator 40 and said third side edge 733 of side edge 73 is protruding said upper surface 41 of insulator 40 too, in this manner, both said upper surface 71 of trace 70 and said third side edge 733 of side edge 73 exposed to atmosphere, meanwhile, said upper surface 71 of trace 70 comprised of a first upper surface 711 and a second upper surface 712, and wherein both said first upper surface 711 and said second upper surface 712 are not co-planar, said first upper surface 711 is protruding the upper surface 41 of insulator, meanwhile, a portion of said first upper surface 711, said second upper surface 712 of trace 70 and said upper surface 41 of insulator 40 are covered with the solder mask 80, wherein said upper surface 741 of extending portion 74 is employed as a portion of said upper surface 71 of trace 70, in this manner, said upper surface 71 of trace 70 further includes said upper surface 741 of extending portion 74, and wherein said upper surface 741 of extending portion 74 (i.e. a portion of said upper surface 71 of trace 70) exposed to the atmosphere for connecting external substance; furthermore, the second upper surface 712 of trace 70 enables to be co-planar to the first upper surface 721 of trace 70 as required, accordingly, it is optional that the first upper surface 711 of trace 70 is not co-planar to the second upper surface 712 of trace 70; and (2). the second lower surface 722 is uneven such as conical and/or curvy or the like, in this manner, the area that said second lower surface 722 contacted to external substance(s) enables to be increased, then it can prevent said external substance from peeling off said trace 70, and then the reliability of said PCB 50 is enhanced, in addition, said extending portion 74 and said trace 70 can be unitary or said extending portion 74 and said trace 70 can be made of different metals.

Figure 8:
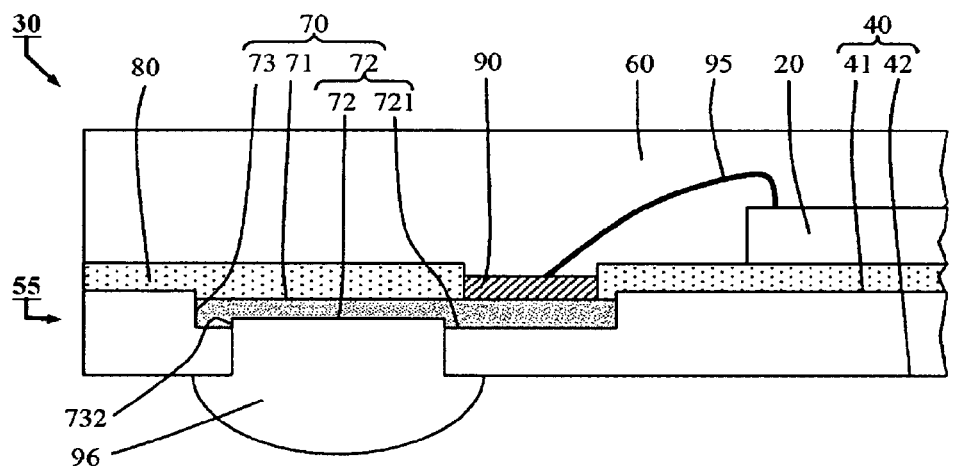
FIG. 8 shows a cross-sectional view of package, wherein the PCB in accordance with the present invention involved in said package is coupled with an encapsulant, a chip, conductive wire(s) and solder ball.
Figure 9:
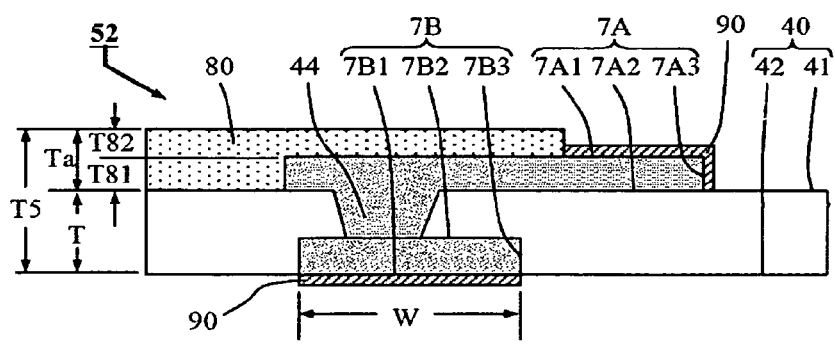
FIG. 9 shows a cross-sectional view of PCB according to a prior art.

FIG. 8 shows a package 30 which is involved in a PCB 55 in accordance with the present invention, said structure of PCB 55 (shown in FIG. 8) is similar to the structure of PCB 55 (shown in FIG. 2), wherein the difference between said PCB 55 (FIG. 8) and said PCB 55 (FIG. 2) is: there is not any conductive layer (90) coupled with the second lower surface 722 of trace 70 (shown in FIG. 8), compared with the second lower surface 722 of trace 70 (shown in FIG. 2); said package 30 further comprised of: a chip 20 which is coupled with said solder mask 80 on the upper surface 41 of insulator 40; a conductive wire 95 which is electrically connected said chip 20 to said PCB 55; an encapsulant 60 which is made of SUMITOMO G1250 or the like, said encapsulant 60 seals said PCB 55, said chip 20 and said conductive wire 95; and a solder ball 96, wherein said solder ball 96 coupled with said second lower surface 722 and said second side edge 732, accordingly, said PCB 55 enables to be coupled with said chip 20 and said encapsulant 60, wherein said chip 20 can be employed as a flip chip, in case of flip chip, then said chip 20 coupled with said PCB 55 through a plurality of conductive bumps and sealed by an adhesive means such as encapsulant; moreover, in case that said package 30 coupled with a mother board (not shown) by said solder ball 96, once said package 30 is attacked by an impact, due to the area that said second lower surface 722 (associated with said second side edge 732) of trace 70 contacted to said solder ball 96 is increased, then it allows said solder ball 96 enables to be coupled with said trace 70 more securely, then it can prevent said conductive layer 90 from peeling off said trace 70, and then the reliability of said PCB 50 can be enhanced. Furthermore, due to the first lower surface 721 of trace 70 encapsulated by said insulator 40, accordingly, said trace 70 can be held by said insulator 40 firmly too, in this manner, it can prevent said trace 70 from peeling off said insulator 40 while impacting, and then the reliability of said PCB 55 can be enhanced, consequently, By means of the second side edge 732 or the first lower surface 721 of trace 70 which is encapsulated by said insulator 40, the reliability of said PCB 55 enables to be enhanced.

In accordance with the foregoing descriptions accompanying drawings, this invention has been described in terms of several preferred embodiments, various alternations and modifications can be made to become apparent to those skilled in the art; For examples: as shown in FIG. 1, wherein the second lower surface 722 enables to be not co-planar to the first lower surface 721 of trace 70 as required, then said trace 70 also having a second side edge (732), moreover, the upper surface 71 of trace enables to be protruding the upper surface 41 of insulator 40, furthermore, an another trace 75 can be instead of said conductive layer 90 as required too; Accordingly, since many such various alterations and/or modifications can be made to the foregoing descriptions, it is to be understood that the scope of the invention is not limited to the disclosed embodiments but is defined by the appended claims.

What is claimed is:

1. A printing circuit board, comprising:
    an insulator having an upper surface, a lower surface, and a recess formed in said lower surface of said insulator; and
    a trace having an upper surface, a lower surface and a side edge, wherein said lower surface of said trace is composed of a first lower surface and a second lower surface, said trace is received in said insulator, wherein said first lower surface of said trace is encapsulated by said insulator, at least a portion of said side edge of said trace is cloaked by said insulator, said upper surface of said trace is exposed out of said upper surface of said insulator, and said second lower surface of said trace is placed within said recess to be exposed;
    wherein said trace further having a second side edge which is defined between said first lower surface and said second lower surface of said trace, said second side edge of said trace is placed in said recess of said insulator.

2. The printing circuit board of claim 1, further comprising another trace which is coupled with the lower surface of said insulator.

3. The printing circuit board of claim 1, wherein at least a portion of said upper surface of said trace is below said upper surface of said insulator, and at least a portion of said upper surface of said trace is exposed.

4. The printing circuit board of claim 1, wherein said side edge of said trace is composed of a first side edge and a third side edge, said first side edge of said trace side edge is cloaked by said insulator, said third side edge of said trace side edge is exposed, at least a portion of said upper surface of said trace protrudes from said upper surface of said insulator.

5. The printing circuit board of claim 4, wherein said trace is further formed with an extending portion having an upper surface and a lower surface, said lower surface of said extending portion is coupled with said upper surface of said insulator, and said upper surface of said extending portion forms a portion of said upper surface of said trace.

6. The printing circuit board of claim 1, further comprising a solder mask coupled with said upper surface of said insulator.

7. The printing circuit board of claim 1, further comprising at least a solder mask coupled with said lower surface of said insulator.

8. The printing circuit board of claim 6, further comprising an encapsulant, wherein a portion of said encapsulant is coupled with said solder mask.

9. The printing circuit board of claim 1, further comprising a conductive layer coupled with said upper surface of said trace, wherein the upper surface of said conductive layer is exposed for connecting an external substance.

10. The printing circuit board of claim 1, further comprising a conductive layer coupled with said second lower surface of said trace and placed within said recess of said insulator, and the upper surface of said conductive layer being exposed for connecting an external substance.

11. The printing circuit board of claim 1, wherein said side edge of said trace is composed of a first side edge and a third side edge, said first side edge and said third side edge are not co-planar.

12. A printing circuit board, comprising:
    an insulator having an upper surface and a lower surface; and
    a trace having an upper surface, a lower surface and a side edge, wherein said side edge is composed of a first side edge and a third side edge, said trace is received in said insulator, said first side edge of said trace is cloaked by said insulator, said third side edge of said trace is exposed, wherein said upper surface of said trace protrudes from said upper surface of said insulator, said third side edge of said trace side edge protrudes from said upper surface of said insulator, at least a portion of said upper surface of said trace is exposed and connected to at least an external substance, and said external substance selectively serves as one of: a solder ball, resistor, capacitor, conductive wire, conductive bump, conductive layer or slot of electrical device;
    wherein the lower surface of said trace is encapsulated by said insulator entirely.

13. The printing circuit board of claim 12, wherein said trace further comprises an extending portion, said extending portion having an upper surface and a lower surface, wherein said lower surface of said extending portion is coupled with said upper surface of said insulator, and said upper surface of said extending portion forms a portion of said upper surface of said trace.

14. The printing circuit board of claim 12, further comprising a solder mask which is coupled with said upper surface of said insulator.

15. The printing circuit board of claim 14, further comprising an encapsulant, wherein a portion of said encapsulant is coupled with said solder mask.

16. The printing circuit board of claim 12, wherein said first side edge and said third side edge are not co-planar.

17. The printing circuit board of claim 12, further comprising a conductive layer coupled with said upper surface of said trace.

* * * * *